(12) United States Patent
Amaducci et al.

(10) Patent No.: US 12,341,483 B2
(45) Date of Patent: Jun. 24, 2025

(54) MULTISTAGE ACTIVE FILTER FOR AUTOMOTIVE APPLICATIONS

(71) Applicant: Schaffner EMV AG, Luterbach (CH)

(72) Inventors: Alessandro Amaducci, Deitingen (CH); Enrico Mazzola, Gerlafingen (CH)

(73) Assignee: Schaffner EMV AG, Luterbach (CH)

( * ) Notice: Subject to any disclaimer, the term of this patent is extended or adjusted under 35 U.S.C. 154(b) by 583 days.

(21) Appl. No.: 17/670,280

(22) Filed: Feb. 11, 2022

(65) Prior Publication Data

US 2022/0263496 A1 Aug. 18, 2022

(30) Foreign Application Priority Data

Feb. 15, 2021 (EP) .................... 21157191

(51) Int. Cl.
| | |
|---|---|
| *H03F 3/45* | (2006.01) |
| *H03H 11/04* | (2006.01) |
| *H03H 11/12* | (2006.01) |

(52) U.S. Cl.
CPC ............. *H03H 11/12* (2013.01); *H03H 11/04* (2013.01)

(58) Field of Classification Search
CPC .................................... H03F 3/45; H03F 1/34
USPC ..................................................... 330/85, 260
See application file for complete search history.

(56) References Cited

U.S. PATENT DOCUMENTS

| | | | |
|---|---|---|---|
| 6,879,816 B2* | 4/2005 | Bult .................... | H03J 3/08 333/81 R |
| 8,823,448 B1* | 9/2014 | Shen .................... | H02M 1/44 327/552 |
| 10,992,129 B2* | 4/2021 | Hu ..................... | H02H 3/162 |
| 2018/0269781 A1 | 9/2018 | Amaducci | |
| 2020/0212791 A1 | 7/2020 | Karinca et al. | |
| 2021/0010707 A1* | 1/2021 | Takahashi ............ | H02M 7/12 |

* cited by examiner

*Primary Examiner* — Henry Choe
(74) *Attorney, Agent, or Firm* — BLANK ROME LLP

(57) ABSTRACT

An active filter for suppressing an unwanted noise component from an electric supply line connecting a noise source and a load device, the active filter comprising a first active stage and a second active stage on the supply line, wherein the first active stage is between the noise source and the second active stage, wherein the first active stage has a first attenuation, and the second active stage has a second attenuation, characterized in that the first attenuation is lower than the second attenuation.

8 Claims, 2 Drawing Sheets

MULTISTAGE ACTIVE FILTER FOR AUTOMOTIVE APPLICATIONS

REFERENCE DATA

The present application claims priority of European patent application EP21157191 of Feb. 15, 2021, the contents whereof are entirely incorporated.

TECHNICAL DOMAIN

The present invention concerns an electromagnetic compatibility filter for suppressing an unwanted noise component superimposed on an electric supply line. Embodiments of the invention concern a filter placed behind a motor drive unit on a DC power bus, in an electric vehicle, although this is not the only application of the invention.

RELATED ART

Electric systems in vehicles and in industry are becoming ever more complex and include a multitude of components that generate, or are liable to be disturbed by, electromagnetic interferences. Electric motors, for example, are often driven by electronic inverters that control the motor speed and torque by generating waveforms with variable frequency and amplitude. These systems provide high efficiency but generate a powerful electromagnetic noise.

Switching power converters are used in electric and hybrid vehicles, as well as in countless other applications such as driving stationary motors, battery chargers, photovoltaic systems, lighting control, computers, and other. In all these cases, the switching action of the converter is a source of electromagnetic noise that could, if it is not managed or attenuated, affect the functioning of other systems, or exceed normative limits.

Electric or electronic filters used to attenuate these unwanted interferences, called EMI filters in short, are used in all branches of electric engineering to improve reliability and respect existing norms. Well-designed filtering system are essential to the performance of many complex electric systems.

Electric and hybrid vehicles are equipped with different power converters in a very tight space. This coexistence represents a serious electromagnetic problem and demands efficient EMI filtering. When the filters ae not enough to bring the noise to acceptable levels, shielded cables can be used, but they contribute significantly to costs.

It is known to use passive low-pass LC filters to attenuate EMI. While passive solutions do offer substantial attenuation, they have their limits. Magnetic components rated for the current levels used in modern electric vehicles are bulky, expensive, heavy, and not always suitable for mass production.

Document US20180269781 discloses an active EMI filter for an electric vehicle. Active filters can be more compact than equivalent passive ones but providing a satisfactory active filter for the high-current wide-bandwidth interferences generated in electric vehicles is difficult.

Frequency filters, both active and passive, attenuate an unwanted signal in a determined stopband, and are characterized, among other parameters, by the attenuation ratio, also known as insertion loss. In all real cases, the attenuation in the stopband is not constant: it may show a maximum value in the centre of the stopband and diminish moving towards the limits of the stopband. outside the stopband, the attenuation is ideally 0 dB, meaning no attenuation. In reality, the transition between stopband and passband is continuous and the attenuation changes from 0 dB to the nominal attenuation with a certain finite slope.

In the following, the wordings "attenuation" or "insertion loss" without further specification to the frequency will indicate the maximum attenuation in the stopband of a filter.

SHORT DISCLOSURE OF THE INVENTION

An aim of the present invention is the provision of a filter that overcomes the shortcomings and limitations of the state of the art.

According to the invention, these aims are attained by the object of the attached claims, and especially by an active filter comprising a first active stage and a second active stage in cascade on the supply line, wherein the first active stage is between the noise source and the second active stage, wherein the first active stage has a first attenuation, and the second active stage has a second attenuation, and the first attenuation is lower than the second attenuation.

Advantageous embodiments of the invention are the object of the dependent claims and include variants in which the first active stage has a first output dynamic range that is higher than a second output dynamics of the second stage, preferably the first output dynamics being five times the second output dynamics or more, and/or wherein the second attenuation is at least ten time higher than the first attenuation.

Other embodiments of the invention relate to filters where the first active stage is configured to detect a first noise current circulating on the electric supply line and to output a correction current in the supply line, and the output dynamic of the first active stage is at least 1 Ampere peak-to-peak, possibly 2 A peak-to-peak or above. The bandwidths of the first and second active stage should overlap on an interval sufficiently wide to yield the desired comprehensive bandwidth of the filter, for example an interval of at least 1 MHz width.

Preferably the first active filtering stage has moderate attenuation, for example between 16 and 26 dB Each active filter stage may include a current transformer for picking up a noise current circulating on the supply line, a gain stage generating a current correction signal, and an output stage configured to feed back the current correction signal in the supply line. The first active stage, which is a power stage, may include a discrete final stage to deliver the required current, for example a class A or AB amplifier with discrete transistors, or a Howland current pump. The second stage, which is a precision stage, may generally be realized with high-speed operational amplifiers.

SHORT DESCRIPTION OF THE DRAWINGS

Exemplar embodiments of the invention are disclosed in the description and illustrated by the drawings in which.

Figure 6A:
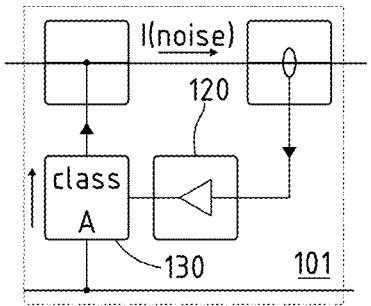

FIG. 6*a* show that the current source 107 of the first active filter is a class A circuit.

Figure 6B:
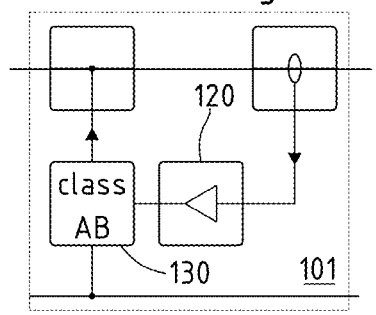

FIG. 6*b* show that the current source 107 of the first active filter is a class AB circuit.

Figure 6C:
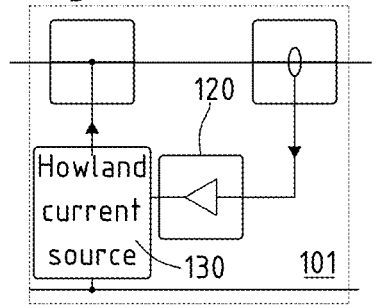

FIG. 6c show that the current source 107 of the first active filter is a Howland current source.

EXAMPLES OF EMBODIMENTS OF THE PRESENT INVENTION

Figure 1:
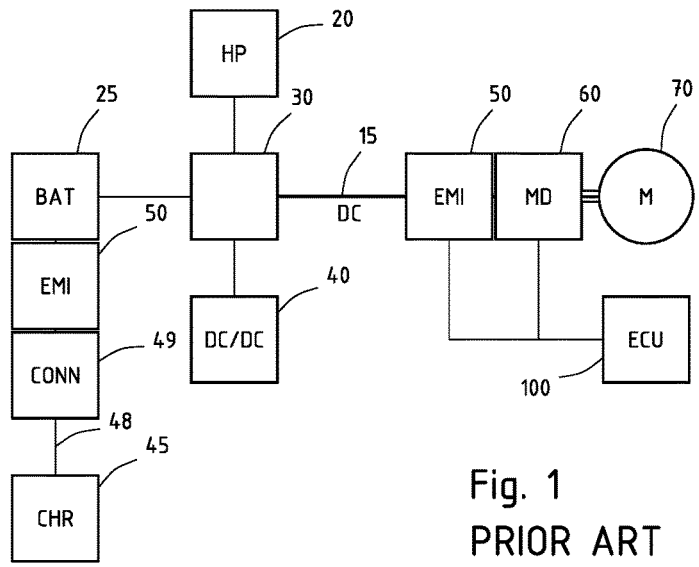
FIG. 1 illustrates schematically a possible structure of an electric vehicle in which the filter of the invention can be employed.

FIG. 1 shows in a very simplified fashion, the main components of an electric vehicle. The energy necessary to the traction is stored in a battery pack 45 and may be replenished by the charger 45 or—in the case of a hybrid vehicle—by a non-illustrated combustion motor. The battery pack 25 is connected to a power distribution unit 30 that distributes the power to various loads, for instance an DC/DC converter 40 for generating a 12V voltage for auxiliary equipment (entertainment, lights, on-board computers, etc.), and heat pumps 20 for the heating/ear conditioning. Importantly, a high-voltage DC bus 15 transmits the voltage of the battery to a motor drive unit 60 that includes an inverter generating multiphase AC waveforms suitable for the electric traction motor 70. An EMI filter 50 is inserted on the DC bus 15 at the supply point of the drive unit 60 to filter out the noise generated by the inverter in the latter.

The configuration of FIG. 1 is just one among the various possibilities and is provided merely as a non-limiting example of one possible use of the invention. The invention may be used in electric vehicles presenting various configurations, for example in series-hybrid, parallel-hybrid, plug-in-hybrid configurations that do not correspond to the diagram of FIG. 1. The invention is not limited to automotive applications, either.

FIG. 1 shows two EMI filters 50, one between battery 25 and charging connector 49, and one on the DC side of the motor drive 60. The inventive EMI filter may be used in other positions without leaving the scope of the invention. Meaningful locations for EMI filters are: before and after the charger 45; after the battery 25; before the DC/DC converter 40. The charging unit 45 may be totally or in part installed after the connector 49. All these variants are included in the scope of the invention defined by the appended claims.

Figure 2:
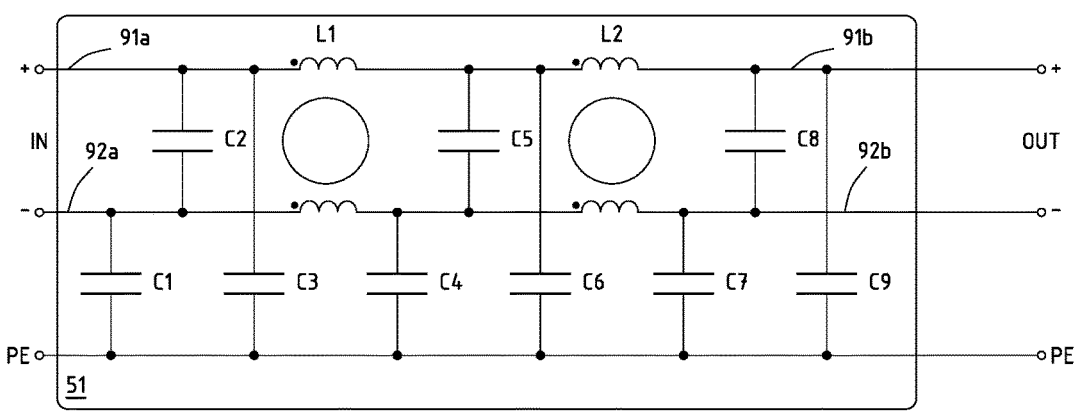
FIG. 2 shows a conventional passive EMI filter.

FIG. 2 shows a possible structure of a passive EMI filter 51 as known in the art. The filter is configured as a two-stage LC filter with two common-mode chokes L1 and L2 and several capacitors connected between the positive and negative power rails (X-capacitors C2, C5, C8) or between a power rail and the protective earth conductor (Y-capacitors C1, C3, C4, C6, C7, C9). Such filters can be designed to provide an effective attenuation of noise at the price of an increase in size, weight, and manufacturing cost.

According to the needs, an EMC filter can be designed to attenuate differential and/or common mode noise. Common mode noise appears simultaneously with the same polarity on all the conductors of the supply bus and is often dominant. The filter of FIG. 2 is designed to attenuate primarily common-mode noise.

Figure 3:
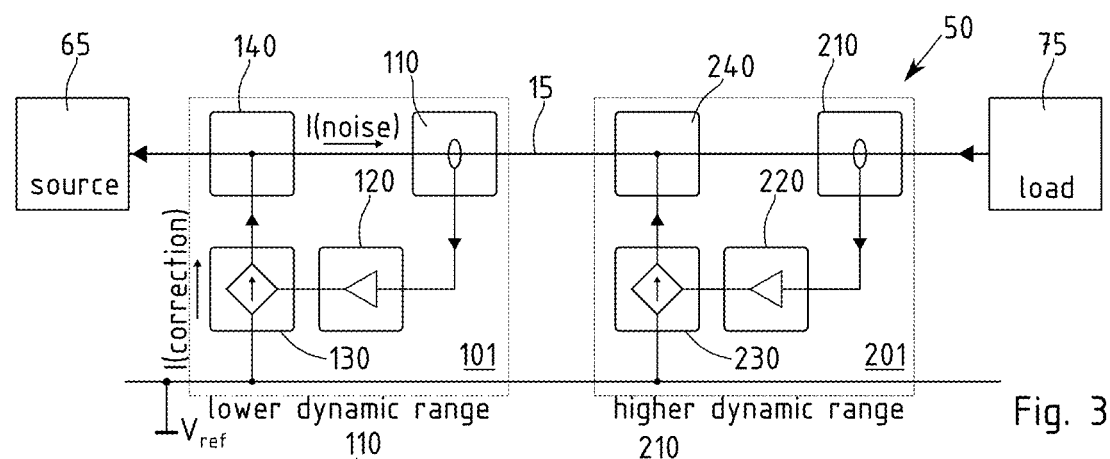
FIGS. 3 and 4 illustrate schematically a structure of a two-stage active filter according to the invention.

FIG. 3 illustrates a possible structure of a filter 50 according to the invention. The inventive filter has two filtering stages: a first active power stage 101 and a second active precision stage 201. The first and second filtering stages are inserted on the supply line 15 one after the other, and each of them attenuates the noise produced by the source device 65 by a determined amount, or insertion loss. The comprehensive attenuation of the filter 50, taken as a ratio between the noise at the output and at the input, is the product of the attenuations of the first and second stage.

FIG. 3 is drawn as a unifilar scheme, and power line 15 is represented by a single line. This is a simplification of a real implementation in which the power line 15 may include several conductors. In an important, but not exclusive, implementation, the supply line 15 may be a HVDC bus in an electric vehicle comprising a positive rail and a negative rail. The filter may be designed to attenuate a differential noise or, preferably, a common-mode noise component.

Also FIG. 3 shows a filter with a "current sensing/current injecting" topology that senses a current and injects a corresponding correction current. The invention is not limited to this case, however, and may also include filters that sense the noise as a voltage disturbance of the supply line, and/or include a voltage source to inject a voltage on the supply line, or filters with an output circuit that is neither a pure current source nor a pure voltage source. In the following description will introduce "current sense units" at the input of the filters, and "current sources" at the output but, they could be replaced by voltage sensors, respectively voltage sources, or by sensor and sources that are neither pure current nor pure voltage type, without leaving the scope of the invention.

In the illustrated embodiment, the first and second active stages have a feedback configuration. The first stage 101 has a current sense unit 110, which could be a current transformer, that reads the noise current flowing out of the stage's output, as an error signal, an analogue signal conditioning stage 120 that is designed to amplify the error signal in a determined frequency band, a current source 130 that inserts, through the current insertion circuit 140, a correction current on the supply line 15.

The second stage 201 has a corresponding general structure, in this example, with current sense unit 210, conditioning stage 220, current source 230, injection circuit 240.

As it is known, ideally such a feedback filter provides, in closed loop an attenuation that is given by $Y=X/(1+H)$ where Y denotes the signal at the filter's output, X the signal at the input, and H is the open-loop gain. In reality, additional factors will be introduced by non-ideal behaviour of the sensor, and so on. The invention, however, is not limited to this topology of filter and may also include, for example, feed-forward filters.

First and second active filtering stages have a dynamics limit, that is the maximum current that they can inject back on the supply line and rely on a power supply (not represented) for their work. Their performance is guaranteed into a determined bandwidth, where their operating parameters (for example the insertion loss) respect nominal values. The bandwidth of the filtering stages will be determined in consideration of the noise bandwidth. In a typical automotive application, a bandwidth of at least 1 MHz is required.

The first active filtering stage is inserted on the supply line after the noise source (eventually with a passive pre-filtering stage) and should be capable of injecting a current having the same intensity as the noise current. According to an important aspect of the invention, the first active filtering stage has an output dynamic of at least 300 mA peak-to-peak, preferably at least 1 Ampere peak-to-peak. Demanding applications may have noise amplitudes of 2 A peak-to-peak or more, and the output dynamics of the first active filtering stage should match these figures.

Figure 4:
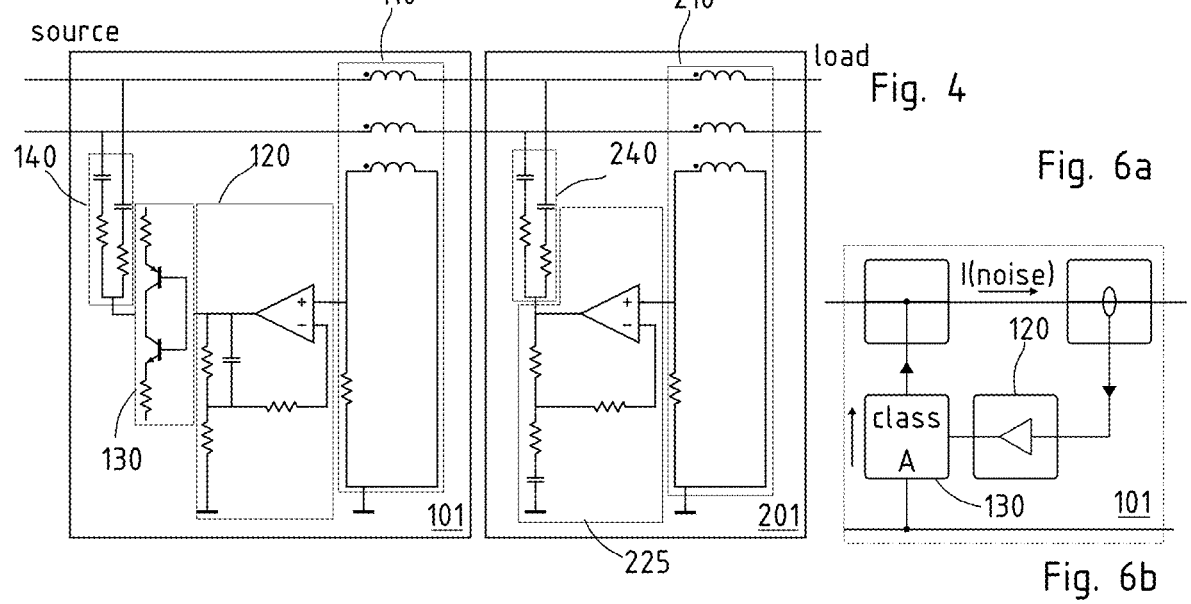

The required dynamic can be obtained in several ways, for example a final stage with discrete transistors in a class A or AB amplifier. FIG. 4 represents this in an idealized, non-limiting way. This configuration is advantageous because it approximates the high output impedance of a current source, but it is not the only one possible. In other non-represented variants, the filter of the invention may include a push-pull output stage or field-effect transistors.

The first signal conditioning stage 120 amplifies the signal received by the first current transformer 110 and may be obtained, as shown, by a high bandwidth operational amplifier. The signal conditioning stage 120 and the final stage 130 determine largely the open loop gain of the first active filter and its attenuation. The inventors have determined that a moderate amplification in the first active stage is advantageous in that it leads to a wide-bandwidth and stable filter.

In embodiments, the gain of the first stage may be lower than 50 (current amplitude ratio) in all the useful bandwidth, which corresponds to an attenuation of less than 35 dB. In many relevant use cases, stability and bandwidth require that the gain be limited to 16-25 dB, for example, the first stage may be designed with a gain never exceeding 10 or, in other words, an attenuation of no more than 20 dB.

The compensation current delivered by the current source 130 is injected into the supply line by the RC injection stage.

The second active filtering stage 201 is used to cut off what noise is not eliminated by the first stage. Its output dynamic is lower than that of the first stage 101, but it has higher forward gain and better attenuation. The second active filtering stage is therefore a precision filter stage that eliminates the residual noise that the first power stage could not correct. It may have the same general structure as the first stage, with a current transformer 210, an amplifier and current source 225 using a high-speed operational amplifier, and a RC injection stage 240.

While the first active stage has a gain stage 120 and a separate output stage 130 that is configured as a current source, the second precision active stage 210 may have just amplifier 225 that amplifies the noise current signal and provides directly the required compensation current to the injection network 240. The attenuation of the second stage may be of 40 dB, or higher, and its output dynamics may be one fifth that of the first stage or less, for example 400 mA peak-to-peak.

Otherwise said, the attenuation of the second stage is higher than the attenuation of the first stage. For example, the attenuation of the second stage may be five times higher, or better, ten time higher than the attenuation of the first stage. The output dynamics of the first and second stage are the opposite: the dynamics of the first stage is larger than that of the second stage, for example three times more, or better five times more.

Figure 5:
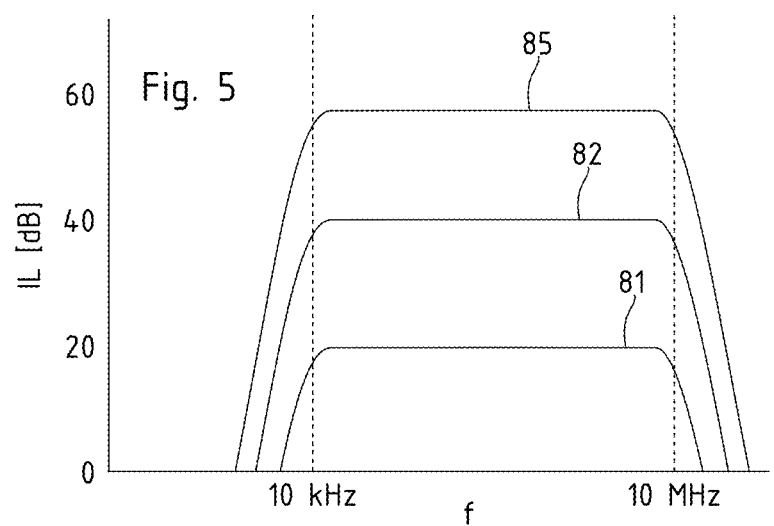
FIG. 5 is a plot of a frequency response function.

FIG. 5 is an idealized attenuation plot of the filter of the invention, in a bandwidth from 10 kHz to 10 MHz, where most of the noise generated by automotive switching converters is found. Curve 81 represents the frequency-dependent attenuation of the first active stage 101 that never exceeds 20 dB, since the gain of this stage is moderate, while curve 82 represents the attenuation of the second active stage 201, that is of about 40 dB. The insertion loss of the filter, comprehensive of the attenuation introduced by the first and second stages, is plotted as curve 83.

Thus, the invention uses a more complex electronic circuit than conventional active filters, in that two active attenuation stages in cascade. The first stage, closer to the noise source, is a power stage that provides only little attenuation, but still reduces the maximum noise to a level that can be dealt with by the second stage 201, which is a precision stage with high gain and attenuation.

REFERENCE SIGNS 15 supply line, DC bus
20 heat pump
25 battery pack
30 power distribution unit
40 DC/DC converter
45 charger
48 charge line
49 connector
50 EMC filter
51 passive filter
60 motor drive unit
65 noise source
70 motor
75 load, victim device
81 frequency response function
82 frequency response function
85 frequency response function
91a positive supply, input (source side)
91b positive supply, output (load side)
92a negative supply, input (source side)
92b negative supply, output (load side)
100 ECU
101 first active filter stage (power stage)
110 first current sense, current transformer
120 first amplifier, signal conditioning
130 first current source
140 first current injection
201 second active filter stage (precision stage)
210 second current sense, current transformer
220 second amplifier, signal conditioning
225 amplification and output stage
230 second current source
240 second current injection

The invention claimed is:

1. An active filter for suppressing an unwanted noise component from an electric supply line connecting a noise source and a load device, the active filter comprising a first active filter and a second active filter on the supply line, wherein the first active filter is between the noise source and the second active filter, wherein the first active filter has a first attenuation, and the second active filter has a second attenuation, wherein the first attenuation is lower than the second attenuation, wherein the first active filter and the second active filter have each a current transformer configured to detect a noise current circulating on the supply line, a gain stage, generating a current correction signal, and an output stage configured to feed back the current correction signal in the supply line.

2. The active filter of claim 1, wherein the first active filter has a first output dynamic range that is higher than a second output dynamics of the second filter, preferably the first output dynamics being five times the second output dynamics or more.

3. The active filter of claim 1, wherein the second attenuation is at least ten times higher than the first attenuation.

4. The active filter of claim 1, wherein the first active filter is configured to detect a first noise current circulating on the electric supply line and to output a correction current in the supply line, wherein the output dynamic of the first active filter is at least 1 Ampere peak-to-peak.

5. The active filter of claim 1, wherein the first active filter has a first bandwidth, the second active filter has a second bandwidth, and the first and second bandwidth have an overlap of at least 1 MHz width.

6. The active filter of claim 1, wherein the attenuation of the first active filter is less than 26 dB, preferably less than 20 dB.

7. The active filter of claim 1, wherein the first active filter has a final stage with discrete transistors in a class A or AB amplifier, or a Howland current pump.

8. An active filter for suppressing an unwanted noise component from an electric supply line connecting a noise source and a load device, the active filter comprising a first active stage and a second active stage on the supply line, wherein the first active stage is between the noise source and the second active stage, wherein the first active stage has a first attenuation, and the second active stage has a second attenuation, wherein the first attenuation is lower than the second attenuation, wherein the first active stage and the second active stage have each a current transformer configured to detect a noise current circulating on the supply line, a gain stage, generating a current correction signal, and an output stage configured to feed back the current correction signal in the supply line.

* * * * *